United States Patent
Jain et al.

(10) Patent No.: US 11,164,616 B2
(45) Date of Patent: Nov. 2, 2021

(54) BIAS GENERATION CIRCUITRY

(71) Applicant: Arm Limited, Cambridge (GB)

(72) Inventors: Piyush Jain, Noida (IN); Surya Prakash Gupta, Noida (IN); El Mehdi Boujamaa, Valbonne (FR); Cyrille Nicolas Dray, Antibes (FR); Akshay Kumar, New Delhi (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/506,641

(22) Filed: Jul. 9, 2019

(65) Prior Publication Data

US 2021/0012823 A1    Jan. 14, 2021

(51) Int. Cl.
*G11C 11/16* (2006.01)
*H03K 19/20* (2006.01)

(52) U.S. Cl.
CPC ...... *G11C 11/1697* (2013.01); *G11C 11/1673* (2013.01); *H03K 19/20* (2013.01)

(58) Field of Classification Search
CPC .. G11C 11/1697; G11C 11/1673; H03K 19/20
USPC ........................................................ 365/158
See application file for complete search history.

(56) References Cited

U.S. PATENT DOCUMENTS

| | | | | |
|---|---|---|---|---|
| 3,482,223 A * | 12/1969 | Spandorfer | ............ | G11C 11/04 365/139 |
| 4,670,675 A * | 6/1987 | Donoghue | ............ | G11C 7/062 327/53 |
| 6,134,141 A * | 10/2000 | Wong | .................. | G11C 7/1039 365/185.03 |
| 6,259,627 B1* | 7/2001 | Wong | .................. | G11C 11/5621 365/185.03 |
| 7,656,710 B1* | 2/2010 | Wong | ................. | G11C 16/3459 365/185.19 |
| 7,724,579 B2* | 5/2010 | Park | ....................... | G11C 16/28 365/185.21 |
| 2006/0018169 A1* | 1/2006 | Aakjer | ..................... | G11C 7/08 365/205 |
| 2013/0258762 A1* | 10/2013 | Chih | ..................... | G11C 11/161 365/158 |
| 2015/0357036 A1* | 12/2015 | Park | .................... | G11C 11/1673 365/148 |
| 2018/0150576 A1* | 5/2018 | Gharia | ................ | G06F 30/3312 |
| 2019/0156756 A1* | 5/2019 | Aizawa | ................ | G09G 3/3688 |

* cited by examiner

*Primary Examiner* — Sung Il Cho
*Assistant Examiner* — Sung I Cho
(74) *Attorney, Agent, or Firm* — Pramudji Law Group PLLC; Ari Pramudji

(57) ABSTRACT

Various implementations described herein are directed to device having a memory block and a sense amplifier coupled to the memory block. The device may include a bias generator that applies a bias signal to the sense amplifier for regulating read current to the sense amplifier for faster activation of the memory block.

20 Claims, 9 Drawing Sheets

BIAS GENERATION CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional circuit designs, magneto-resistive memory typically uses an analog bias signal for regulating read current. Some bias generators may save static power during idle/chip-disable/light-sleep periods. However, some of these conventional bias generators suffer from high activation times, which degrades memory performance by negatively impacting access time or chip enable (CEN) setup time. So there is a need to reduce this penalty on access time while maintaining low static power consumption.

In some cases, magneto-resistive memory may use an analog bias signal for active tuning of read reference resistance. However, this type of analog bias signal may have heavy capacitive loading. Therefore, some conventional bias generators may have a large settling time during wake-up, which is not beneficial. So there is also a need to improve wake-up speed without increasing static power consumption.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to bias generation schemes and techniques for magneto-resistive random access memory (MRAM). For instance, the various schemes and techniques described herein provide bias activation of analog bias circuits to improve performance in MRAM. In some instances, fast activation at low static power may be used for instantaneous turn-on of analog bias during active read cycles. In other instances, fast activation at low static power may be used for analog bias generation during wake-up. As such, the various implementations described herein provide a pulsed activation scheme for a "read current" bias generator that is coupled with instantaneous turn-on by turning-on multiple parallel distributed bias generators to achieve fast activation and low static power consumption. During low activity periods, various implementations described herein may provide for maintaining a crude bias signal voltage level through a low current bias generator. Also, reactivation of multiple bias generators may be achieved at the beginning of a read operation to improve bias signal level from its crude level to a local variability mitigated accurate level. Also, configurability of some parallel distributed bias generators may be activated during pulsed activation for fast turn-on, kept on after activation to maintain a 'crude' level of the bias signal, and turned-on instantaneously at the beginning of a read operation to reduce local variability effects. Further, the various implementations described herein may provide a pulsed activation scheme for improving activation time of a "read reference" bias generator by turning on a high slew rate amplifier during activation to achieve fast activation and low static power consumption Various implementations of bias generation schemes and techniques will be described in detail herein with reference to FIGS. 1-8.

Figure 1:
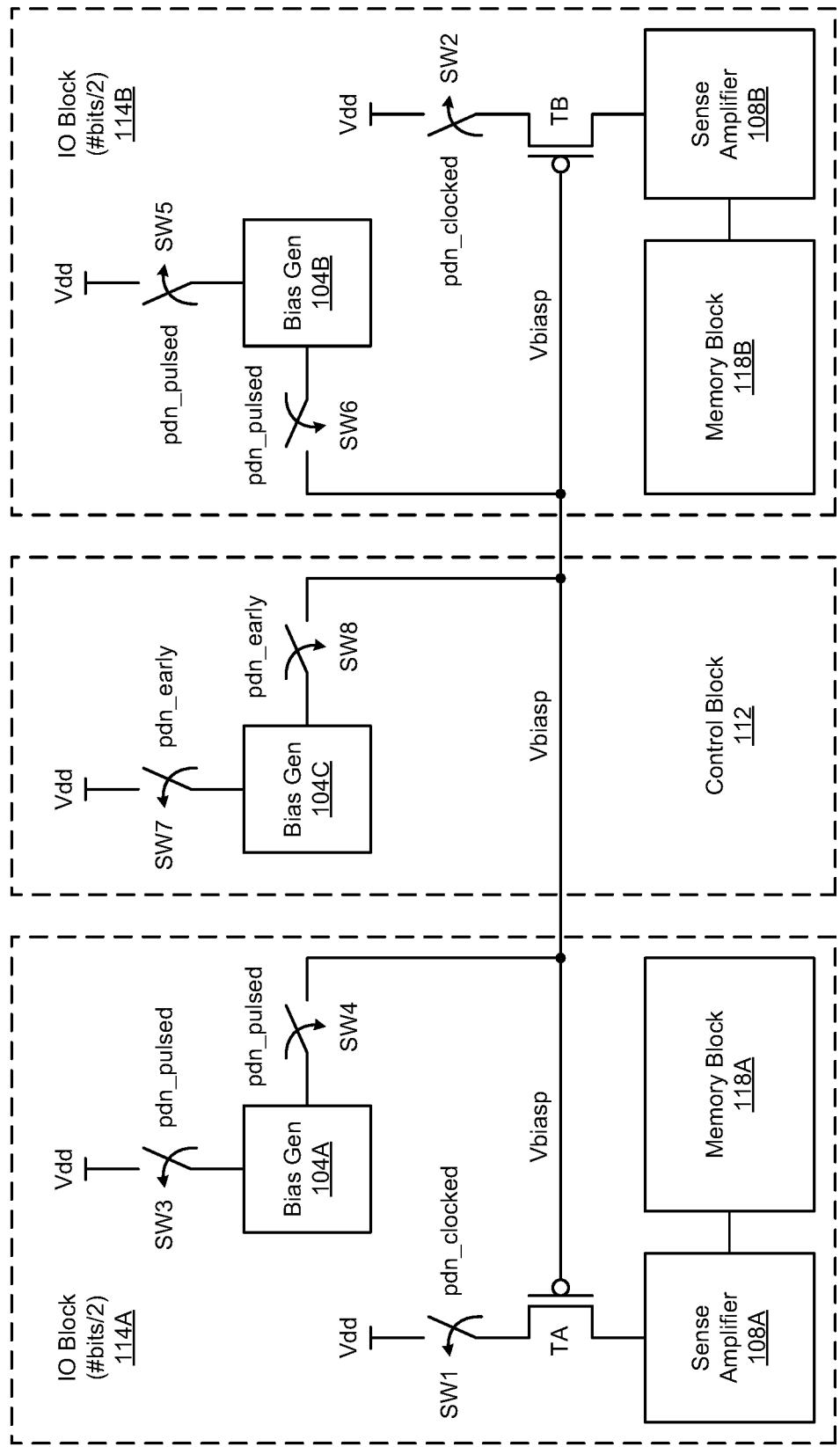
FIG. 1 illustrates a diagram of bias generation circuitry in accordance with various implementations described herein.

FIG. 1 illustrates a diagram 100 of bias generation circuitry 102 in accordance with various implementations described herein. In some instances, the bias generation circuitry 102 may be implemented as an integrated circuit in a system or a device having various circuit components that are arranged and coupled together as an assemblage or combination of parts that provide for a physical circuit design and related structures. Also, in some instances, a method of designing, providing and building the bias generation circuitry 102 may involve use of the various circuit components described herein so as to thereby implement various schemes and techniques associated therewith.

In reference to FIG. 1, the bias generation circuitry 102 may include memory circuitry having one or more memory blocks 118A, 118B, including, e.g., a first memory block 118A and a second memory block 118B. In some instances, the one or more memory blocks 118A, 118B may include one or more memory arrays having bitcells that utilize magnetic tunneling junctions (MTJs) to store a data bit value of 1 or 0. In other instances, the one or more memory blocks 118A, 118B may include magneto-resistive random access memory (MRAM) blocks, and as such, the one or more memory arrays may be one or more MRAM arrays.

The bias generation circuitry 102 may include various block circuitry, such as, e.g., at least one control block 112 and one or more input-output (10) blocks 114A, 114B for any number of bits, such as, e.g., #bits/2, in the memory blocks 118A, 118B, which may be referred to as memory blocks. As shown in FIG. 1, the blocks 112, 114A, 114B may include various circuit components that are arranged and configured to assist with providing a voltage biasing signal (Vbiasp). In some instances, the voltage biasing signal (Vbiasp) may be a pulsed bias signal for pulsed activation of the memory blocks 118A, 118B during a read cycle. Also, regulating read current to sense amplifier circuitry may provide for faster activation of the memory circuitry (including the memory blocks 118A, 118B) and lower static power consumption.

The bias generation circuitry 102 may include sense amplifier circuitry having one or more sense amplifiers 108A, 108B coupled to the memory circuitry. For instance, as shown, a first sense amplifier 108A may be coupled to the first memory block 118A, and also, a second sense amplifier 108B may be coupled to the second memory block 118B. In some instances, a first pass transistor (TA) may be coupled between a supply voltage (Vdd) and the first sense amplifier 108A, and a second pass transistor (TA) may be coupled between the supply voltage (Vdd) and the second sense amplifier 108B. Also, a first switch (SW1) may be coupled between the supply voltage (Vdd) and the first pass transistor (TA), and the first switch (SW1) may be activated and deactivated with a clocked pulse signal (pdn_clocked). In addition, a second switch (SW2) may be coupled between the supply voltage (Vdd) and the second pass transistor (TB), and also, the second switch (SW2) may be activated and deactivated with the clocked pulse signal (pdn_clocked).

In some implementations, the transistors (TA, TB) may be p-type metal-oxide-semiconductor (PMOS) transistors. However, in other implementations, the transistors (TA, TB) may be n-type MOS (NMOS) transistors. Also, in various implementations, the switches (SW1-SW7) may be implemented with P-type and/or N-type transistors, such as, e.g., PMOS transistors and/or NMOS transistors.

The bias generation circuitry 102 may include one or more bias generators 104A, 104B, 104C that are configured to apply a voltage bias signal (Vbiasp) to the one or more sense amplifiers 108A, 108B for regulating read current to the one or more sense amplifiers 108A, 108B for faster activation of the one or more memory blocks 118A, 118B. The bias generators 104A, 104B, 104C may apply the voltage bias signal (Vbiasp) to the sense amplifier circuitry (including the sense amplifiers 108A, 108B) during power-up. As such, the bias generators 104A, 104B, 104C may include high slew rate amplifiers that apply the voltage bias signal (Vbiasp) to the sense amplifiers 108A, 108B during power-up for achieving faster activation and lower static power consumption.

In some implementations, a first bias generator 104A may be coupled to gates of the pass transistors (TA, TB) via a voltage biasing node (Vbiasp), and also, a second bias generator 104B may be coupled to the gates of the pass transistors (TA, TB) via the voltage biasing node (Vbiasp). Also, a third switch (SW3) may be coupled between the supply voltage (Vdd) and the first bias generator 104A, and the third switch (SW3) may be activated and deactivated with the clocked pulse signal (pdn_pulsed). Also, a fourth switch (SW4) may be coupled between the first bias generator 104A and the voltage biasing node (Vbiasp), and the fourth switch (SW4) may be activated and deactivated with the clocked pulse signal (pdn_pulsed). Also, in some instances, the bias generators 104A, 104B may be disposed within the control block 112.

Similarly, a fifth switch (SW5) may be coupled between the supply voltage (Vdd) and the second bias generator 104B, and in this instance, the fifth switch (SW5) may be activated and deactivated with the clocked pulse signal (pdn_pulsed). Also, as shown, a sixth switch (SW6) may be coupled between the second bias generator 104B and the voltage biasing node (Vbiasp), and in this instance, the sixth switch (SW6) may also be activated and deactivated with the clocked pulse signal (pdn_pulsed).

In some instances, the bias generation circuitry 102 may include a third bias generator 104C as part of the control block 112. As shown, a third bias generator 104C may be coupled to the gates of the pass transistors (TA, TB) via the voltage biasing node (Vbiasp). Also, a seventh switch (SW7) may be coupled between the supply voltage (Vdd) and the third bias generator 104C, and the seventh switch (SW7) may be activated and deactivated with an early clocked pulse signal (pdn_early). Also, an eighth switch (SW8) may be coupled between the third bias generator 104C and the voltage biasing node (Vbiasp), and in this instance, the eighth switch (SW8) may be activated and deactivated with the early clocked pulse signal (pdn_early). Also, in some instances, the bias generator 104C may be disposed within one of the 10 blocks 114A, 114B.

In some implementations, the bias generators 104A, 104B, 104C may include low current bias generators that may be configured to maintain the voltage biasing signal (Vbiasp) at a first voltage level during low activity of the memory circuitry including the memory blocks 118A, 118B. Also, the multiple bias generators 104A, 104B, 104C may be coupled in parallel to selectively apply the voltage biasing signal (Vbiasp) to gates of pass transistors (TA, TB) so that the supply voltage (Vdd) passes to the sense amplifiers 108A, 108B. In this instance, the bias generators 104A, 104B, 104C may selectively apply the voltage biasing signal (Vbiasp) to the gates of the pass transistors (TA, TB) to reduce activation time of the memory blocks 118A, 118B. Thus, in some instances, the bias generators 104A, 104B, 104C selectively apply the voltage biasing signal (Vbiasp) to the gates of the pass transistors (TA, TB) such that the supply voltage (Vdd) is selectively applied to the sense amplifiers 108A, 108B so as to reduce activation time of the memory circuitry including the memory blocks 118A, 118B.

In some implementations, one or more of the clocked pulse signals (pdn_early, npdn_early, pdn_pulse, npdn_pulse) may be generated by a control unit integrated with the memory circuit. However, in other instances, one or more of the clocked pulse signals (pdn_early, npdn_early, pdn_pulse, npdn_pulse) may be provided by a chip designer when integrating the memory circuit into a SoC (system-on-a-chip). In some instances, a logic circuit may be designed inside the control unit of the memory circuit to generate the clocked pulse signals (pdn_early, npdn_early, pdn_pulse, npdn_pulse). However, each of these clocked pulse signals (pdn_early, npdn_early, pdn_pulse, npdn_pulse) may not be necessarily generated from a clock circuit. For instance, the pdn_early signal may be generated using the CEN signal, from which the pdn_pulse signal may be generated using the CEN signal, and in other instances, the clocked pulse signal (pdn_clocked) may be generated from the clock signal only.

The bias generation circuitry 102 including the components therein may be implemented as an integrated circuit (IC) with memory circuitry, such as, e.g., MRAM, and/or any other similar types of memory. The bias generation circuitry 102 may also be integrated with computing circuitry and related components on a single chip. Further, the bias generation circuitry 102 may be implemented in embedded systems for various types of electronic, mobile, Internet-of-Things (IoT) and/or biometric applications.

Figure 2A:
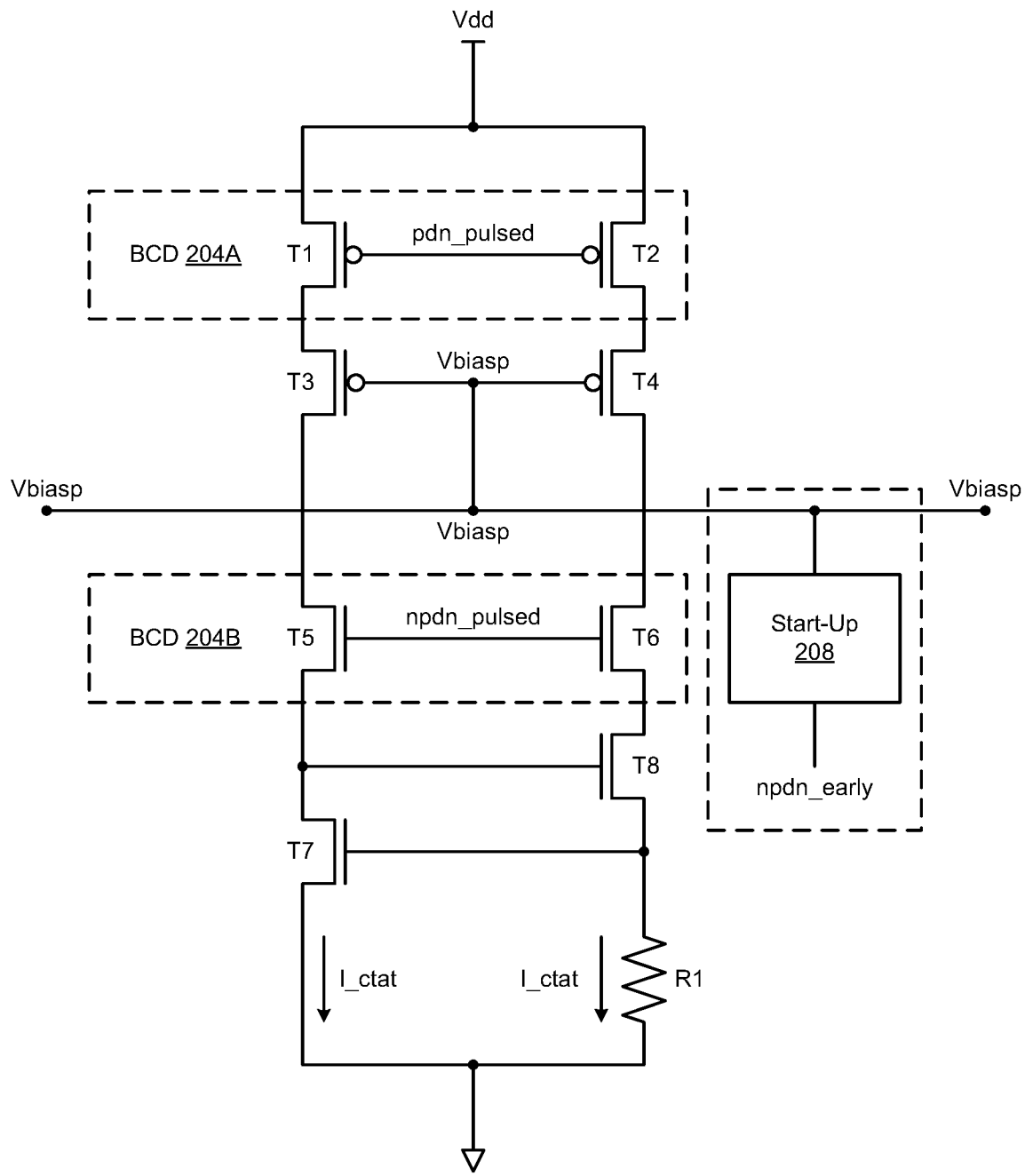
FIGS. 2A-2B illustrate diagrams of bias activation circuitry in accordance with various implementations described herein.
Figure 2B:
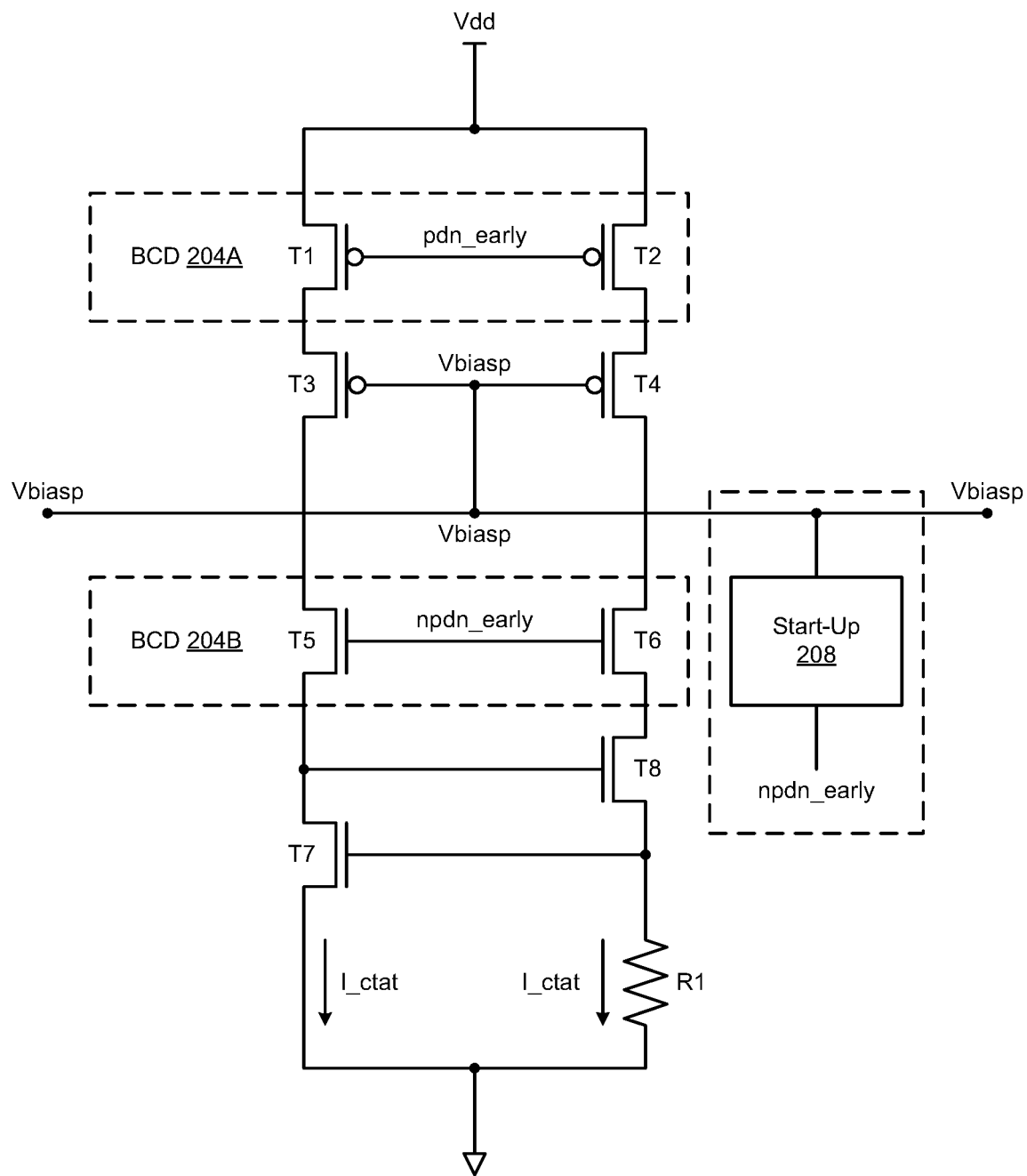

FIGS. 2A-2B illustrate various diagrams of bias activation circuitry 200A, 200B in accordance with implementations described herein. In particular, FIG. 2A illustrates a diagram of bias circuitry 200A that may be implemented as the bias generation circuitry 104A, 104B of FIG. 1, and also, FIG. 2B illustrates another diagram of bias circuitry 200B that may be implemented as the bias generation circuitry 104C of FIG. 1.

As shown in FIG. 2A, the bias generation circuitry 104A, 104B may include one or more bias current drivers (BCD) 204A, 204B that apply the voltage biasing signal (Vbiasp) to the sense amplifier circuitry for regulating read current to the sense amplifier circuitry for faster activation of the memory block 118A, 118B. The bias generation circuitry 104A, 104B may be referred to as low current bias generators that maintain the voltage biasing signal (Vbiasp) at a first voltage level during low activity of the memory blocks. The bias generation circuitry 104A, 104B may apply the voltage biasing signal (Vbiasp) to the sense amplifier circuitry during an active read cycle, and also, the bias generation circuitry 104A, 104B may reactivate the bias current drivers (BCD) 204A, 204B at the beginning of the read cycle to increase the first voltage level of the voltage biasing signal (Vbiasp) to a second voltage level. Also, in some instances, the bias generation circuitry 104A, 104B may apply the voltage biasing signal (Vbiasp) to the sense amplifier circuitry during power-up. As such, the bias generation circuitry 104A, 104B may operate as a high slew rate amplifier that applies the voltage biasing signal (Vbiasp) to the sense amplifier circuitry during power-up for achieving faster activation and lower static power consumption. Further, in some instances, the sense amplifier circuitry may include the sense amplifier circuitry 108 of FIG. 3, which is described herein below.

The one or more bias current drivers (BCD) 204A, 204B may include a first BCD 204A and a second BCD 204A. The first BDC 204A may include transistors (T1, T2) coupled between the supply voltage (Vdd) and transistors (T3, T4). The second BDC 204B may include transistors (T5, T6) coupled between the transistors (T3, T4) and transistors (T7, T8). In some instances, the clocked pulse signal (pdn_pulsed) may be coupled to the gates of the transistors (T1, T2), and also, an inverted clocked pulse signal (npdn_pulsed) may be coupled to the gates of the transistors (T5, T6). Also, the voltage biasing node (Vbiasp) may be coupled to the gates of the transistors (T3, T4), and the gates of the transistors (T7, T8) are cross-coupled, wherein the gate of transistor (T7) is coupled to an output of the transistor (T6), and the gate of transistor (T8) is coupled to an output of the transistor (T5). The transistor (T7) may be coupled between the transistor (T5) and ground (Vss or Gnd), and also, the transistor (T8) may be coupled between the transistor (T6) and ground (Vss or Gnd) via resistor (R1).

In some instances, the bias generation circuitry 104A, 104B may include start-up circuitry 208 that is coupled to the voltage biasing node (Vbiasp), and the early clocked pulse signal (pdn_early) may be coupled to the start-up circuitry 208. In this instance, the early clocked pulse signal (pdn_early) may be used to activate and deactivate the start-up circuitry 208. Also, as shown in FIG. 2A, a current source (I_ctat) may be developed across the resistor (R1) during operation of the bias generation circuitry 104A, 104B.

In some instances, the transistors (T1, T2, T3, T4) may be PMOS transistors, and the transistors (T5, T6, T7, T8) may be NMOS transistors. However, in other instances, the transistors (T1, T2, T3, T4) may be implemented with NMOS transistors, and the transistors (T5, T6, T7, T8) may be implemented with PMOS transistors.

In some implementations, as shown in FIG. 2B, the bias generation circuitry 104C may have similar scope, operation and components as the bias generation circuitry 104A, 104B in FIG. 2A, except for application and use of the early clocked pulse signal (pdn_early). For instance, as shown in FIG. 2B, the bias current drivers (BCD) 204A, 204B may receive the early clocked pulse signal (pdn_early), instead of the clocked pulse signal (pdn_pulsed). As such, in this instance, the early clocked pulse signal (pdn_early) may be coupled to the gates of the transistors (T1, T2), and also, an inverted early clocked pulse signal (npdn_early) may be coupled to the gates of the transistors (T5, T6).

Thus, as shown in FIG. 2A, the bias current drivers (BCD) 204A, 204B may be activated and deactivated with the clocked pulse signals (pdn_pulsed, npdn_pulsed), and as shown in FIG. 2B, the bias current drivers (BCD) 204A, 204B may be activated and deactivated with the early clocked pulse signals (pdn_early, npdn_early).

Figure 3:
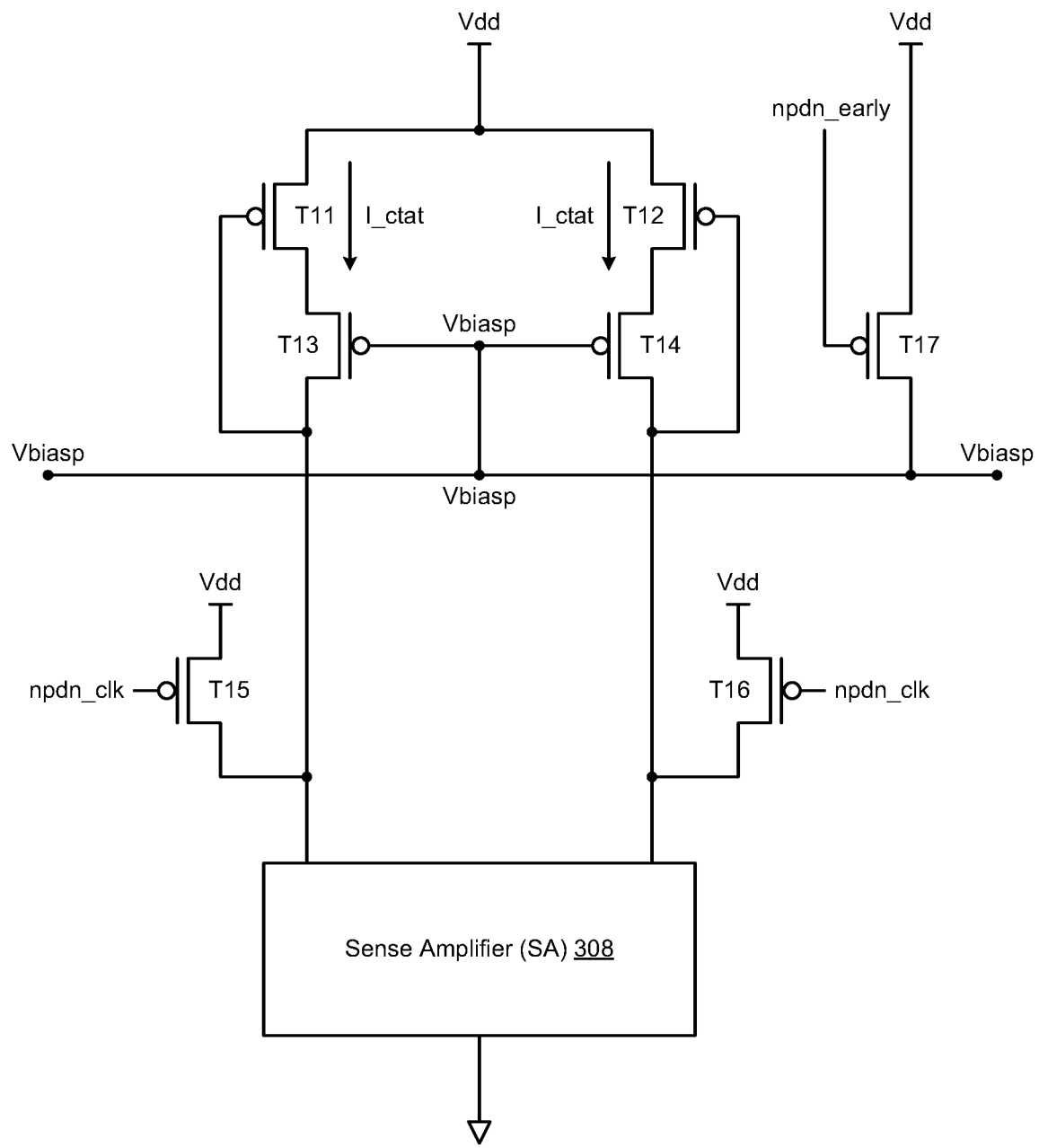
FIG. 3 illustrates a diagram of sense amplifier circuitry in accordance with various implementations described herein.

FIG. 3 illustrates a diagram 300 of sense amplifier circuitry 108 in accordance with various implementations described herein. In some instances, FIG. 3 illustrates a diagram of sense amplifier circuitry 108 that may be implemented as the sense amplifier circuitry 108A, 108B of FIG. 1.

As shown in FIG. 3, the sense amplifier circuitry 108 may include transistors (T11, T12) coupled between the supply voltage (Vdd) and transistors (T13, T14), and the sense amplifier circuitry 108 may include the transistors (T13, T14) coupled between the transistors (T11, T12) and sense amplifier (SA) 308. The gate of transistor (T11) may be coupled to the output of the transistor (T13), and also, the gate of transistor (T12) may be coupled to the output of the transistor (T14). Also, the gates of transistors (T13, T14) may be coupled to the voltage biasing node (Vbiasp).

In some instances, transistors (T15, T16) may be coupled between the supply voltage (Vdd) and the sense amplifier (SA) 308, such that the output of the transistor (T15) is coupled between transistor (T13) and the sense amplifier (SA) 308, and such that the output of the transistor (T16) is coupled between transistor (T14) and the sense amplifier (SA) 308. In this instance, the clock signal (npdn_clk) may be coupled to the gates of the transistors (T15, T16) for activation and deactivation thereof. Also, as shown, the sense amplifier circuitry 108 may include transistor (T17) coupled between the supply voltage (Vdd) and the voltage biasing node (Vbiasp). In this instance, the inverted early clocked pulse signal (npdn_early) may be coupled to the gate of the transistor (T17) for activation and deactivation thereof.

In some instances, the voltage biasing signal (Vbiasp) may be used to activate and deactivate the sense amplifier circuitry 108. Also, as shown in FIG. 3, the current source (I_ctat) may be developed across the transistors (T11, T12) during operation of the sense amplifier circuitry 108.

In some instances, the transistors (T11, T12, T13, T14, T15, T16, T17) may be PMOS transistors. However, in other instances, the transistors (T11, T12, T13, T14, T15, T16, T17) may be implemented with NMOS transistors.

Figure 4:
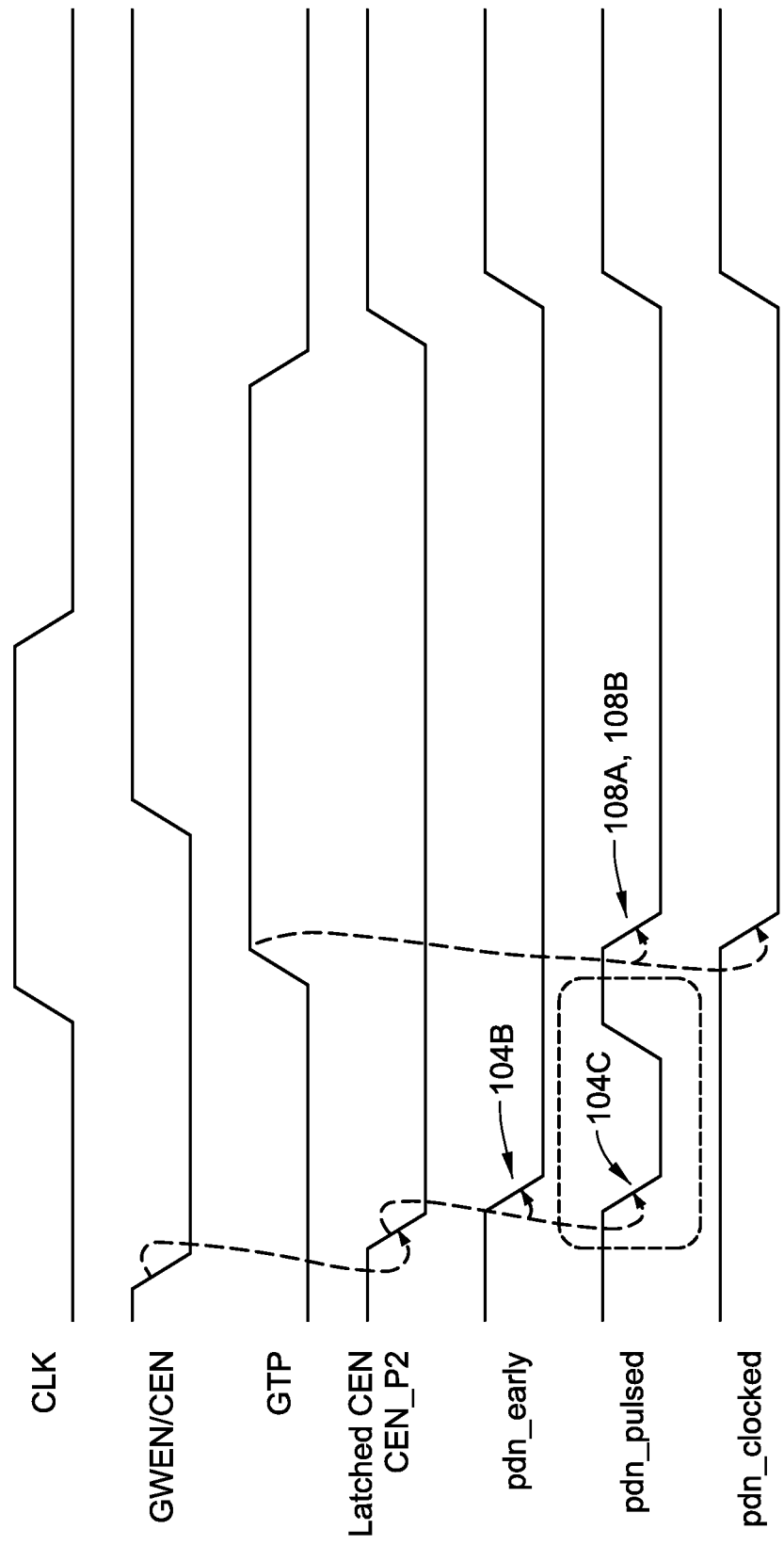
FIG. 4 illustrates a graph of a pulse waveform diagram in accordance with various implementations described herein.

FIG. 4 illustrates a graph 400 of a pulse waveform diagram 402 in accordance with various implementations described herein.

As shown in FIG. 4, the pulse waveform diagram 402 provides waveforms for a clock signal (CLK), a global write enable signal (GWEN, or CEN), a global timing pulse (GTP), and a latched enable signal (CEN_P2). In addition, the pulse waveform diagram 402 provides waveforms for the early clocked pulse signal (pdn_early), the clocked pulse signal (pdn_pulsed), and the clocked pulse signal (pdn_clocked).

In some instances, the falling edge of the GWEN signal may trigger the falling edge of the CEN_P2 signal, and the falling edge of the CEN_P2 signal may trigger the falling edge of the early clocked pulse signal (pdn_early) for activating the bias generation circuitry 104A. Also, in some instances, the falling edge of the CEN_P2 signal may trigger the falling edge of the clocked pulse signal (pdn_pulsed) for activating the bias generation circuitry 104C. Also, in some instances, the rising edge of the GTP signal may trigger the falling edge of the clocked pulse signal (pdn_pulsed) for activating the sense amplifier circuitry 108A, 108B, and also, the rising edge of the GTP signal may trigger the falling edge of the clocked pulse signal (pdn_clocked).

Figure 5:
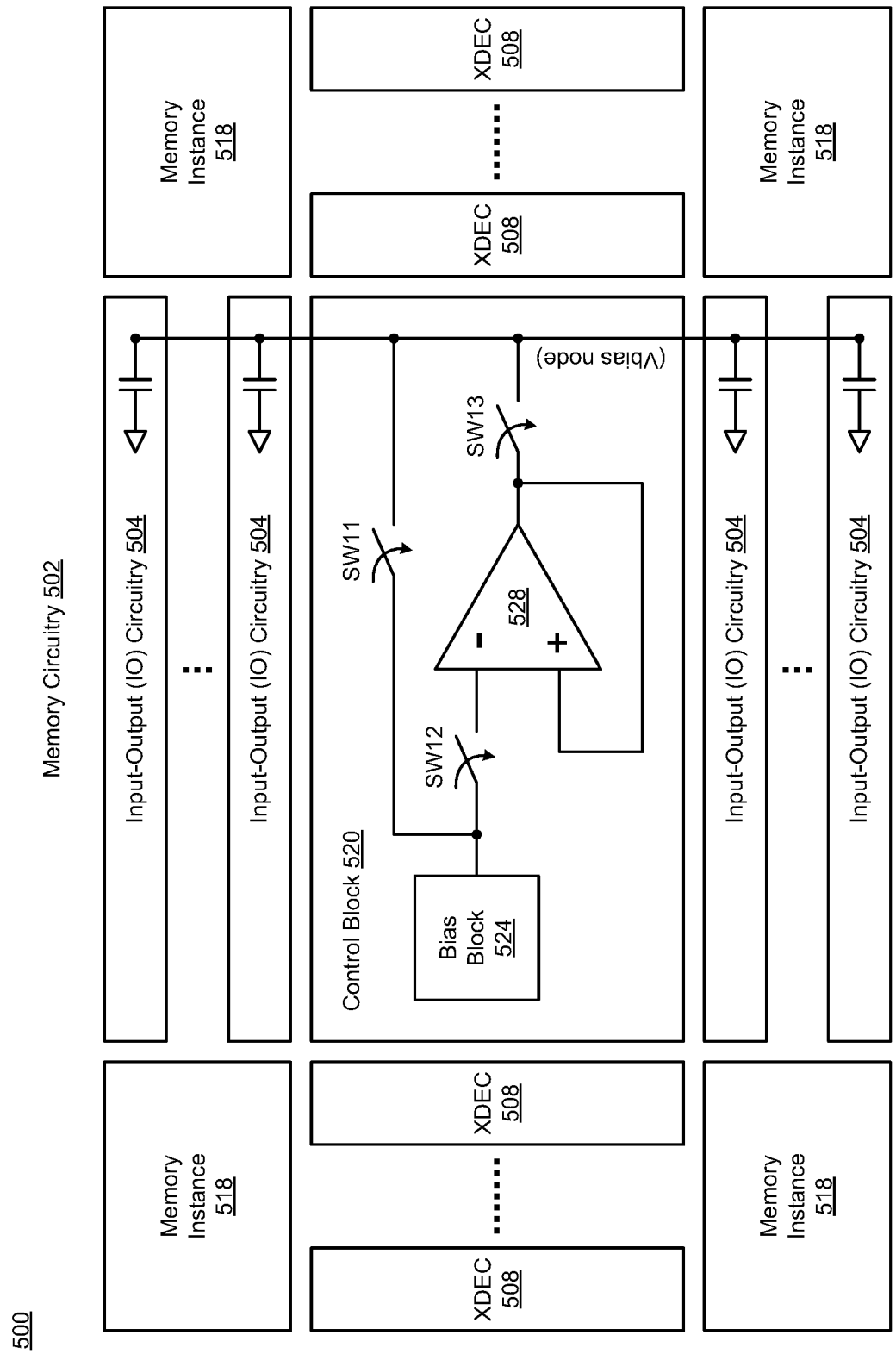
FIG. 5 illustrates a diagram of memory circuitry in accordance with various implementations described herein.

FIG. 5 illustrates a block diagram of memory circuitry 500 in accordance with various implementations described herein.

As shown in FIG. 5, the memory circuitry 500 may include input-output (10) circuitry 504, decoder circuitry (XDEC) 508, and memory blocks 518 that are arranged and coupled together to access data bit values stored in an array of bitcells in the memory blocks 518. In some instances, the input-output (10) circuitry 504 may be referred to as column decoder circuitry, and decoder circuitry (XDEC) 508 may be referred to as row decoder circuitry 508. Also, the memory circuitry 500 may include a control block 520 that controls the IO circuitry 504 and the XDEC circuitry 508, and the control block 520 may be configured to generate the voltage biasing signal (Vbiasp). As shown, the control block 520 may be coupled to the IO circuitry 504 so as to provide the voltage biasing signal (Vbiasp) to the IO circuitry 504.

In some instances, the control block 520 may include a bias block 524, one or more switches (SW11, SW12, SW13), and an operational amplifier 528 that are arranged and coupled together to generate and provide the voltage biasing signal (Vbiasp) to the IO circuitry 504. In some instances, the operational amplifier 528 may provide for a high slew rate analog buffer for high-speed start-up. Also, as shown, the one or more switches (SW11, SW12, SW13) may include a first switch (SW11) coupled between the bias block 524 and the voltage biasing node (Vbias), and the one or more switches (SW11, SW12, SW13) may include a second switch (SW12) coupled between the bias block 524 and an inverting input (−) of the operational amplifier 528. The one or more switches (SW11, SW12, SW13) may include a third switch (SW13) that is coupled between an output of the operational amplifier 528 and the voltage biasing node (Vbias). Also, the output of the operational amplifier 528 may be coupled to the non-inverting input (+) of the operational amplifier 528 as a feedback path. Therefore, when the third switch (SW13) is closed, the operational amplifier 528 may provide the voltage bias signal (Vbias) to the voltage biasing node (Vbias), which may refer to a heavily loaded node. Also, the voltage biasing node (Vbias) may be coupled to capacitors disposed in the IO circuitry 504, wherein the capacitors refer to a capacitive load in each IO circuitry 504.

In some implementations, during a start-up phase, the operational amplifier 528 may be used as an analog buffer that supplies current to settle down the final bias value within a particular time period. Once steady state is reached, the bias block 524 may not need to supply current even if connected to the heavily loaded node (Vbias). Therefore, the bias block 524 may be directly coupled to the heavily loaded node (Vbias), which may save power consumption of the analogue buffer. Since DC bias current of the bias block 524 is low overall, then the DC bias current is also low.

Figure 6:
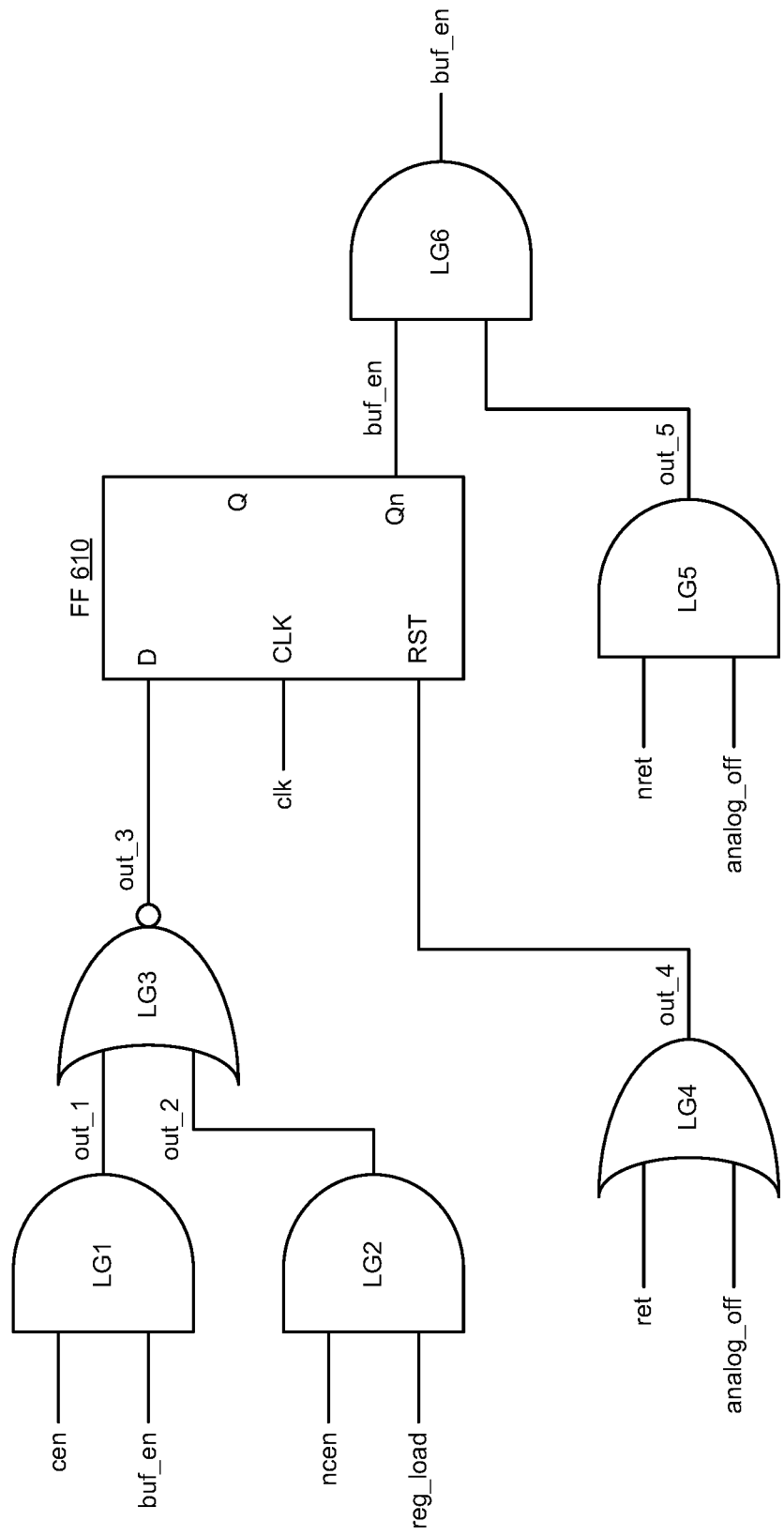
FIG. 6 illustrates a diagram of bias block circuitry in accordance with various implementations described herein.

FIG. 6 illustrates a diagram 600 of bias block circuitry 602 in accordance with various implementations described herein. In some instances, the bias block circuitry 602 in FIG. 6 may be implemented as the bias block 524 of FIG. 5. Also, the bias block circuitry 602 may be referred to as sticky bit circuitry 604. In some implementations, the bias block circuitry 602 may be implemented as a bias generator that includes multiple logic gates that are arranged and coupled together to apply the bias signal (Vbias) to sense amplifier circuitry for regulating read current to a sense amplifier for faster activation of a memory block. As such, the bias generator may be configured to apply the bias signal (Vbias) to a sense amplifier during power-up.

As shown in FIG. 6, the bias block circuitry 602 may include one or more logic gates (LG) that are arranged and coupled together to receive various input signals (cen, ncen, reg_load, ret, nret, analog_off) and provide an output signal (buf_en). For instance, a first logic gate (LG1) may receive the cen input signal, receive the buf_en output signal (as a feedback signal), and provide an output signal (out_1) to a third logic gate (LG3). Also, a second logic gate (LG2) may receive the ncen input signal, receive the reg_load input signal, and provide an output signal (out_2) to the third logic gate (LG3). The third logic gate (LG3) may receive the output signals (out_1, out_2) and provide an output signal (out_3) to a flip flop (FF 610). Also, a fourth logic gate (LG4) may receive the ret input signal, receive the analog_off input signal, and provide an output signal (out_4). The flip-flop (FF 610) may receive the output signal (out_3) at a data input (D), receive a clock signal (clk) at a clock input, receive the output signal (out_4) at a reset input (RST), and provide a buffer enable signal (buff_en) from an inverted output (Qn). Also, a fifth logic gate (LG5) may receive the nret input signal, receive the analog_off signal, and provide an output (out_5). In addition, a sixth logic gate (LG6) may receive the buffer enable signal (buff_en), receive the output signal (out_5), and provide an output signal (buf_en) as a output from the bias block circuitry 602. In various implementations, other logic gate combinations may be used to perform similar logic based operations, wherein similar inputs may be received to thereby provide similar outputs as shown in FIG. 6.

In reference to a sticky bit implementation of the sticky bit circuitry 604, a sticky bit will be set high (i.e., on, or 1) at power-up, of when analog voltages have to change, due to trimming of the bias voltage. Also, the sticky bit will be set low (i.e., off, or 0), when functional operation starts. In some instances, the sticky bit may be used to decide if the analog buffers are ON for speed, or OFF for static current reduction. In other instances, if extra analog circuitry is to stay ON for speed, or OFF for static current reduction.

Figure 7:
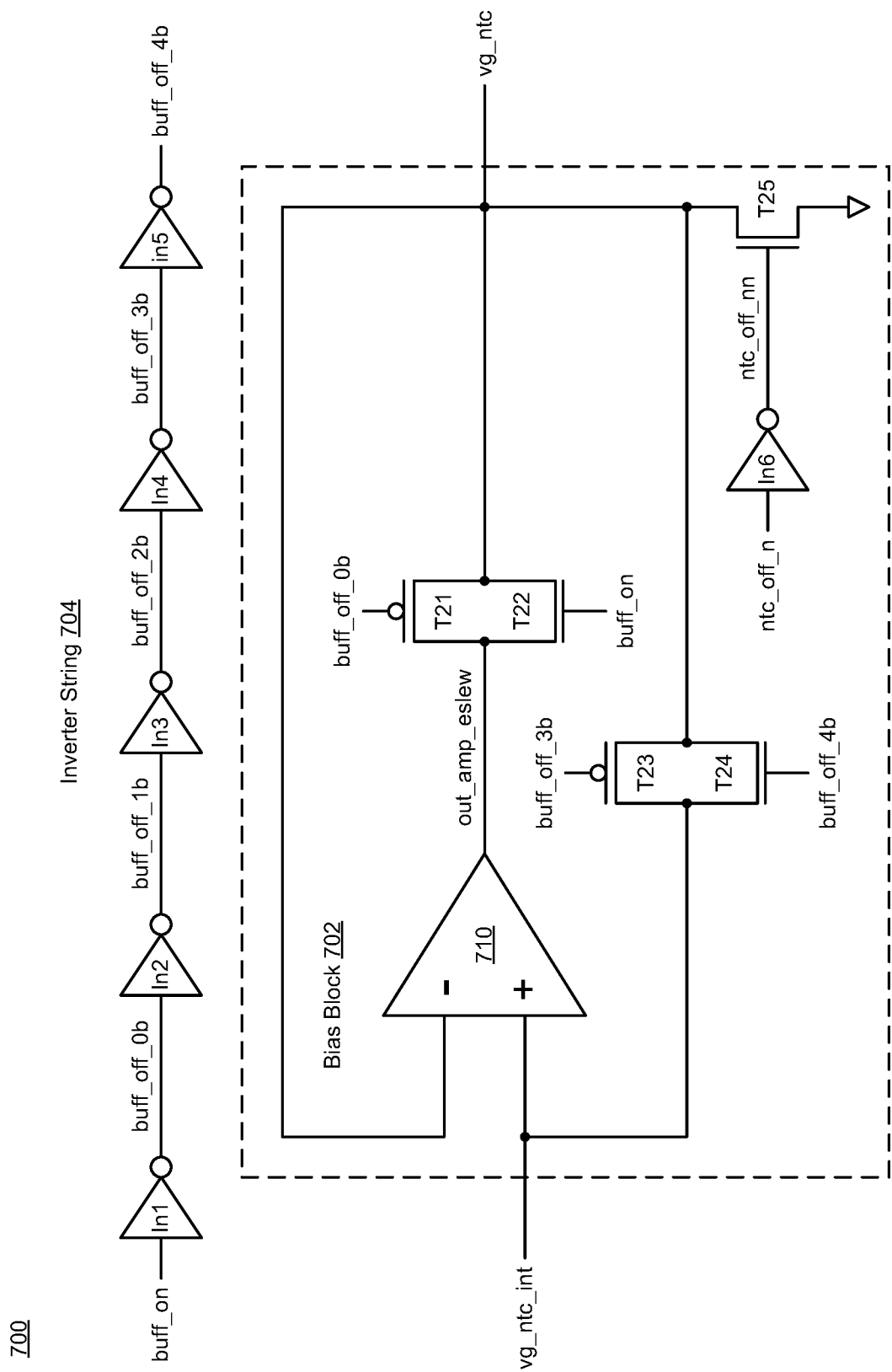
FIG. 7 illustrates a diagram of bias block circuitry in accordance with various implementations described herein.

FIG. 7 illustrates a diagram 700 of bias block circuitry 702 in accordance with various implementations described herein. In some instances, the bias block circuitry 702 in FIG. 7 may be implemented as the bias block 524 of FIG. 5. Also, the bias block circuitry 702 may use one or more signals generated with an inverter string 704.

As shown in FIG. 7, the inverter string 704 may include multiple inverters (In1, In2, In3, In4, in5) that are coupled in series. In some instances, a first inverter (In1) may receive an input signal (buff_on) and provide an intermediate signal (buff_off_0b), and a second inverter (In2) may receive the intermediate signal (buff_off_ob) and provide another intermediate signal (buff_off_1b). Also, a third inverter (In3) may receive the intermediate signal (buff_off_1b) and provide another intermediate signal (buff_off_2b), and a fourth inverter (In4) may receive the intermediate signal (buff_off_2b) and provide another intermediate signal (buff_off_3b). Also, a fifth inverter inverter (In5) may receive the intermediate signal (buff_off_3b) and provide an output signal (buff_off_4b). In some instances, the inverter string 704 may be referred to as an internal ring oscillator based delay generator that uses external signals to generate an internal pulse, and the inverter string 704 may be used as a sticky bit based analog buffer turn-on/turn-off.

Also, the bias block circuitry 702 may include an operational amplifier 720, one or more pass transistors (T21, T22, T23, T24), an inverter (In6), and an output transistor (T25). The operational amplifier 720 may receive an input signal (vg_ntc_int) at a non-inverting input (+), receive an output signal (vg_ntc) at an inverting input (−) as a feedback signal, and provide an intermediate signal (out_amp_eslew). The pass transistors (T21, T22) may be coupled between the output of the operational amplifier 710 and the output node (vg_ntc), and the pass transistors (T23, T24) may be coupled between the non-inverting input (+) of the operational amplifier (710) and the output node (vg_ntc). Also, the pass transistor (T21) may be activated with the (buff_off_0b) signal, and the pass transistor (T22) may be activated with the (buff_on) signal. The pass transistor (T23) may be activated with the (buff_off_3b) signal, and the pass transistor (T24) may be activated with the (buff_off_4b) signal. The inverter (In6) may receive an input signal (ntc_off_n) and provide an inverted input signal (ntc_off_nn) to a gate of the output transistor (T25) for activation thereof. Also, the output transistor (T25) may be coupled between the output node (vg_ntc) and ground (Vss or Gnd).

In some instances, the transistors (T21, T23) may be PMOS transistors, and the transistors (T22, T24, T25) may be NMOS transistors. However, in other instances, the transistors (T21, T23) may be implemented with NMOS transistors, and the transistors (T22, T24, T25) may be implemented with PMOS transistors.

Figure 8:
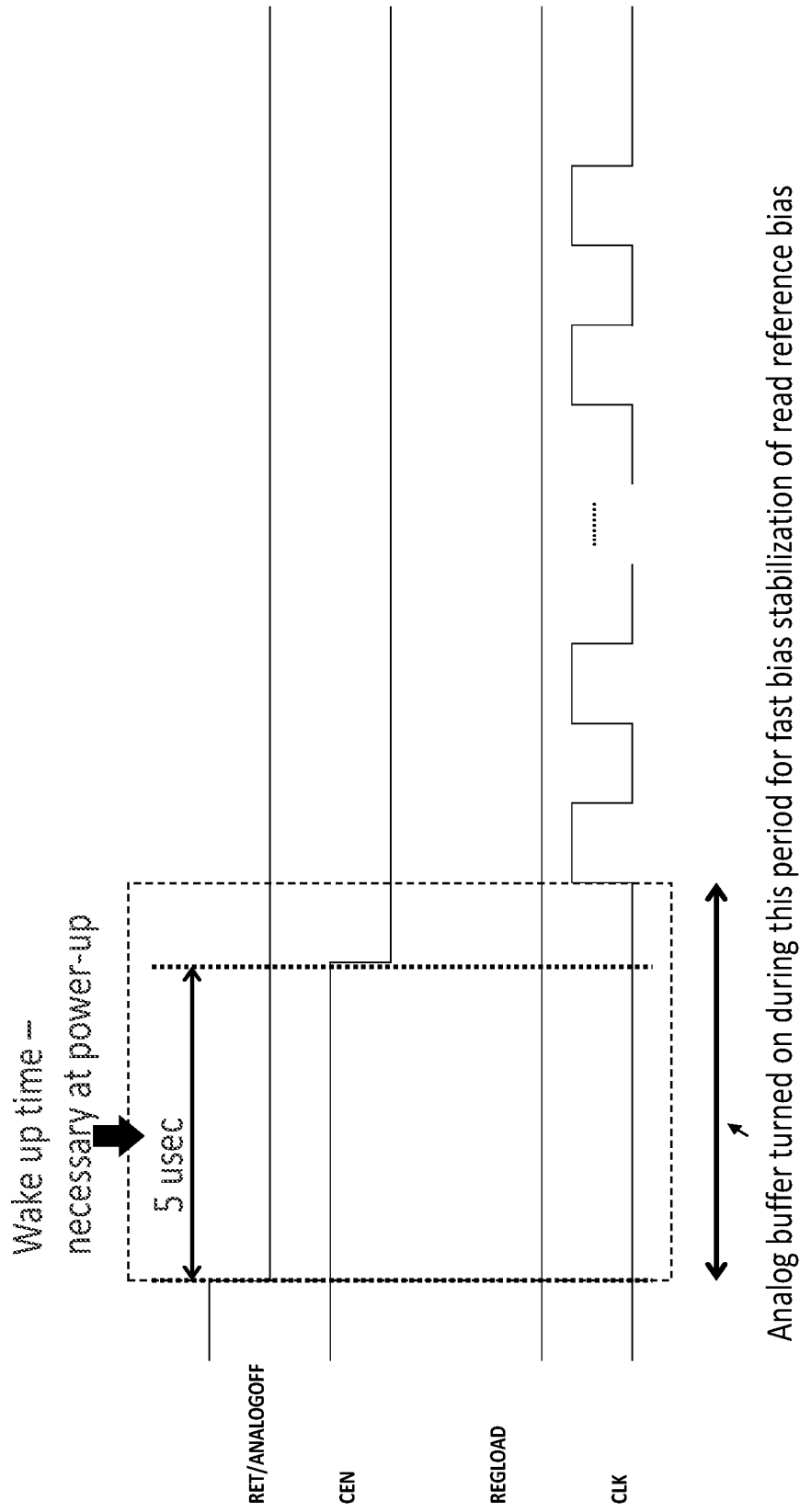
FIG. 8 illustrates a graph of a pulse waveform diagram in accordance with various implementations described herein.

FIG. 8 illustrates a graph 800 of a pulse waveform diagram 802 in accordance with various implementations described herein.

As shown in FIG. 8, the pulse waveform diagram 802 provides various graphs of waveforms for the ret/analog_off signal, the cen signal, the reg_load signal, and the clk signal, as described in reference to FIGS. 6-7. The pulse waveform diagram 802 shows a wake-up time speed-up using an analog buffer. In some instances, the wake-up time at power-up needed may be approximately 5 micro-seconds (usec). Various techniques described herein may turn-on at power-up and then turn-off after a first operation is triggered in memory. Thus, the analog buffer may be turned-on during this power-up or wake-up period for fast bias stabilization of read reference bias.

Described herein are various implementations of a device. The device may include a memory block and a sense amplifier coupled to the memory block. The device may include a bias generator that applies a bias signal to the sense amplifier for regulating read current to the sense amplifier for faster activation of the memory block.

Described herein are various implementations of a system. The system may include a memory array having memory cells and a sense amplifier coupled to the memory cells. The system may include a bias generator having multiple bias current drivers that are configured to apply a bias signal to the sense amplifier for regulating read current to the sense amplifier for faster activation of the memory cells.

Described herein are various implementations of a method. The method may include providing a memory block and coupling a sense amplifier to the memory block. The memory may include applying a bias signal to the sense amplifier for regulating read current to the sense amplifier for faster activation of the memory block.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   two or more memory blocks;
   two or more sense amplifiers respectively coupled to the two or more memory blocks; and
   at least one generators that selectively applies a bias signal to the two or more sense amplifiers for regulating read current to the two or more sense amplifiers, wherein the bias signal comprises a pulsed bias signal for activation of the two or more memory blocks, wherein the at least one generator comprises a bias current driver configured to apply the pulsed bias signal to the two or more sense amplifiers, and wherein the bias current driver is configured to be activated or deactivated by a clocked pulse signal.

2. The device of claim 1, wherein the pulsed bias signal is configured for different pulsed activation of the two or more memory blocks during a read cycle, and wherein regulating the read current to the two or more sense amplifier provides for faster activation of the two or more memory blocks and lower static power consumption.

3. The device of claim 1, wherein the at least one bias generators is coupled in parallel to apply the pulsed bias signal to the two or more sense amplifiers, and wherein the at least one bias generators selectively applies the pulsed bias signal to the two or more sense amplifiers to reduce activation time of the two or more memory blocks.

4. The device of claim 1, wherein each of the respective bias current drivers is configured to apply the pulsed bias signal to a respective sense amplifier of the two or more sense amplifiers for regulating read current to the respective sense amplifier for faster activation of a respective memory block of the two or more memory blocks, wherein the bias current drivers is configured to be activated or deactivated by one of a first or second clocked pulse signals.

5. The device of claim 4, wherein the at least one bias generator comprises a low current bias generator that maintains the pulsed bias signal at a first voltage level during low activity of at least one of the two or more memory blocks.

6. The device of claim 5, wherein the bias generator applies the pulsed bias signal to the two or more sense amplifiers during an active read cycle, and wherein the bias generators reactivates the bias current drivers at a beginning of the read cycle to increase the first voltage level of the pulsed bias signal to a second voltage level.

7. The device of claim 1, wherein the bias generator comprises multiple logic gates that are arranged and coupled together to apply the pulsed bias signal to the two or more sense amplifiers for regulating the read current to the sense amplifier for faster activation of a respective memory block of the two or more memory blocks.

8. The device of claim 1, wherein the bias generators applies the pulsed bias signal to the two or more sense amplifiers during power-up.

9. The device of claim 1, wherein the two or more memory blocks comprise a magneto-resistive random-access memory (MRAM) block.

10. A device, comprising:
    two or more memory blocks;
    two or more sense amplifiers respectively coupled to the two or more memory blocks; and
    at least one bias generator that selectively applies a bias signal to the two or more sense amplifiers for regulating read current to the two or more sense amplifiers, wherein the bias signal comprises a pulsed bias signal for activation of the two or more memory blocks, wherein the at least one bias generators comprises a high slew rate amplifier that applies the pulsed bias signal to the two or more sense amplifiers during power-up for achieving faster activation and lower static power consumption.

11. A system, comprising:
    a memory array having two or more blocks of memory cells;
    respective sense amplifiers coupled to the two or more blocks of memory cells; and
    at least one bias generators having a bias current drivers that is configured to apply a pulsed bias signal to the respective sense amplifiers for regulating read current to the sense amplifiers for activation of the two or more blocks of memory cells, wherein the at least one bias generator comprises a bias current driver configured to apply the pulsed bias signal to the sense amplifiers, and wherein the bias current driver is configured to be activated or deactivated by a clocked pulse signal.

12. The system of claim 11, wherein the pulsed bias signal is configured for different pulsed activation of the memory array during a read cycle.

13. The system of claim 11, wherein regulating the read current to the sense amplifiers provide for faster activation of the memory array and lower static power consumption.

14. The system of claim 11, wherein the at least one bias generators comprises a low current bias generator that maintains the pulsed bias signal at a first voltage level during low activity of the memory array.

15. The system of claim 11, wherein the memory array comprises a magneto-resistive random-access memory (MRAM) array.

16. A method, comprising:
    providing two or more memory blocks;
    coupling respective sense amplifiers to the two or more memory blocks; and
    selectively applying a pulsed bias signal to the sense amplifiers for regulating read current to the respective sense amplifiers for activation of the two or more memory blocks, and
    coupling at least one bias generator to the sense amplifiers, wherein the at least one bias generator is used for applying the pulsed bias signal to the sense amplifiers, and wherein the at least one bias generator comprises a bias current driver configured to apply the pulsed bias signal to the sense amplifiers, and wherein the bias current driver is configured to be activated or deactivated by a clocked pulse signal.

17. The method of claim 16, further comprising:
    coupling the at least one bias generators to the sense amplifiers, wherein the at least one bias generators is used for applying the pulsed bias signal to the sense amplifiers.

18. The method of claim 16, wherein the at least one bias generators applies the pulsed bias signal to the sense amplifiers during power-up.

19. The method of claim 16, wherein the two or more memory blocks comprise a magneto-resistive random-access memory (MRAM) block.

20. A method, comprising:

providing two or more memory blocks;

coupling respective sense amplifiers to the two or more memory blocks; and selectively applying a pulsed bias signal to the sense amplifiers for regulating read current to the respective sense amplifiers for activation of the two or more memory blocks, wherein at least one bias generators comprises a high slew rate amplifier that applies the pulsed bias signal to the sense amplifiers during power-up for achieving faster activation and lower static power consumption.

* * * * *